United States Patent [19]

Held

[11] Patent Number: 5,227,278

[45] Date of Patent: Jul. 13, 1993

[54] POSITIVE-WORKING, LOW SILVER WASH-OFF CONTACT FILM

[75] Inventor: Robert P. Held, Englishtown, N.J.

[73] Assignee: E. I. Du Pont de Nemours and Company, Wilmington, Del.

[21] Appl. No.: 841,353

[22] Filed: Feb. 27, 1992

[51] Int. Cl.[5] .............................. G03C 1/06
[52] U.S. Cl. .................... 430/264; 430/271; 430/502; 430/566
[58] Field of Search ............ 430/264, 271, 281, 502, 430/566, 961

[56] References Cited

U.S. PATENT DOCUMENTS

| | | | |
|---|---|---|---|
| 3,718,473 | 2/1973 | Gervey et al. | 96/83 |
| 4,923,389 | 5/1990 | Held | 430/264 |
| 4,948,701 | 8/1990 | Held | 430/264 |
| 4,960,673 | 10/1990 | Beck et al. | 430/264 |
| 4,977,057 | 12/1990 | Ishikawa et al. | 430/264 |
| 4,983,489 | 1/1991 | Yamada et al. | 430/264 |
| 4,985,339 | 1/1991 | Koizumi et al. | 430/264 |
| 5,037,719 | 8/1991 | Nakamura | 430/264 |

Primary Examiner—Jack P. Brammer

[57] ABSTRACT

A positive-working, low silver containing, wash-out element comprises a support, a fogged silver halide emulsion layer optionally containing a colorant, a photopolymer layer coated contiguous to silver halide layer and an abrasion layer containing a conventional, wash-out developing agent coated over the photopolymer layer. A process of making a positive image comprises image-wise exposing the above element to actinic radiation, immersing the element in an aqueous alkaline medium, and washing the element with water.

7 Claims, 1 Drawing Sheet

POSITIVE-WORKING, LOW SILVER WASH-OFF CONTACT FILM

BACKGROUND OF THE INVENTION

1. Field of the Invention

This invention relates to photosensitive elements and more particularly to photosensitive elements that employ a reduced quantity of silver halide. Even more particularly, this invention relates to low silver photographic elements that employ photosensitive polymers within the image producing system and produce positive images using a wash-off developing technique.

2. Description of the Prior Art

There are a host of prior art applications relating to wash-off elements, some of which are also related to either low silver or no silver bearing elements. There are also other elements which are reported to contain developed or fogged silver which is employed to improve the image. These prior art references are fully described in U.S. Pat. No. 4,923,389, the substance of which is incorporated herein by reference. This reference teaches a process of forming a negative-working low silver contact film which is developed by wash-off techniques. In the element disclosed in this reference, a dual-layered coating is provided on a support. One layer, coated nearest the support, contains silver halide grains dispersed in a photopolymeric system which includes binder, polymer and initiator. The second layer, or abrasion layer, contains an organic binder and a tanning developer. After an image-wise exposure, the element is developed by immersion into an alkaline solution which causes the tanning developer to migrate image-wise into the silver halide-containing layer and crosslink the polymer contained therein. A negative image is then obtained by washing out the unexposed areas with water.

Neither the aforementioned patent nor any of the prior art elements known to the inventor describe a method for achieving a direct positive image using a low silver element in combination with a photopolymer system and wash-out development.

SUMMARY OF THE INVENTION

It is an object of this invention to provide a positive-working, low silver photographic element which can achieve high density using a wash-out developer system. These and yet other objects are achieved in a positive-working silver wash-off element comprising, in order:

(a) a support;
(b) a gelatino, fogged silver halide emulsion layer;
(c) a layer of a hydrophilic macromolecular organic polymer dispersion medium including a dispersed phase containing
 (i) a least one ethylenically unsaturated monomer having a boiling point above 100° C. at normal atmospheric pressure and being capable of forming a high polymer by free-radical initiated, chain-propagating addition polymerization; and
 (ii) in reactive association with the monomer, at least one free-radical photoinitiator or photoinitiator system activatable by actinic radiation in an amount from 0.01 to 20% by weight of the total solids in the dispersion; and
(d) an abrasion overcoat layer comprising an organic binder and a tanning developer.

In accordance with still another embodiment of this invention, there is provided a process for the preparation of a positive wash-off image from a low silver wash-off element comprising:

(a) image-wise exposing the element defined above to actinic radiation,
(b) treating the element with an alkaline solution whereby the tanning developer contained in said overcoat is released and diffuses through the unexposed areas of the photopolymer layer,
(c) washing the exposed element with water to remove the photopolymer layer, the abrasion layer, and the non image-wise exposed areas of the silver halide layer.

DETAILS OF THE INVENTION

Figure 1:
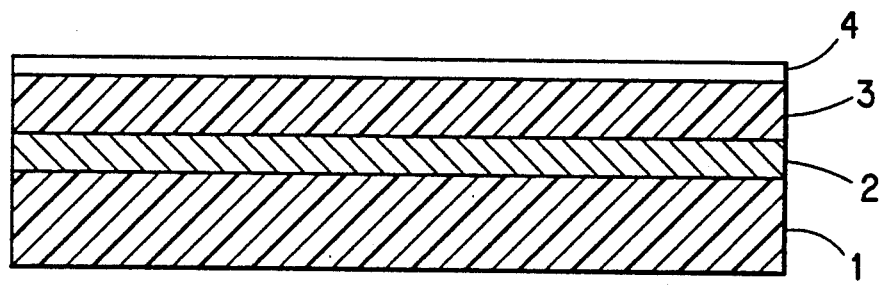
FIG. 1 is a cross-sectional view of a photographic element of this invention.

With reference to FIG. 1, the elements of this invention comprise a support (1); a gelatino silver halide emulsion layer (2), wherein the silver halide grains are fogged; a photopolymer layer (3) comprising a polymer dispersion including a dispersed phase containing an ethylenically unsaturated monomer and an initiator, and an abrasion layer (4) containing a tanning developer.

Supports useful within the ambit of this invention include any of the conventional photographic supports. A transparent support is preferred in the event that the silver halide grains are fogged by giving the element an overall back exposure. If, however the grains are to be fogged by another method, for example by chemical fogging techniques, a transparent support is not any more preferred than non-transparent supports. Particularly useful and preferred within this invention are dimensionally stable polyethylene terephthalate films that contain the requisite resin and gelatin subbing layers to insure the adherence of subsequently coated layers.

The silver halide emulsions useful within this invention comprise dispersions of silver halide grains in gelatin. The silver halide grains may be of the commonly known silver halides including chlorides, bromides, iodides and mixtures thereof. Most preferably the grains are silver chlorobromide wherein the bromide is from 80 to 90 mole percent with the remainder being chloride, although very small amounts of iodide may be present. The grains may be formed by splash precipitation or by balanced double jet, as is well-known known to those skilled in the art, and then dispersed in a bulking amount of gelatin.

The silver halide grains of this invention are those which have been fogged. The fogging causes fog centers to grow within the silver halide grains. On image-wise exposure, those fog centers are destroyed and a direct positive image appears on development. Any of the conventional methods for fogging the silver halide grains may be employed within this invention. Such methods include exposure of the emulsion to actinic radiation or by chemical treatment of the grains. Suitable methods of fogging the grains are disclosed, for example, in Burt, U.S. Pat. No. 3,607,288, the disclosure of which is incorporated by reference.

The emulsion may also contain sensitizers such as chemical sensitizers or spectral sensitizers as well as other adjuvants such as restrainers, antifoggants, coating and wetting aides, hardeners and the like. In addition, other materials to increase the density of the image, for example, small amounts of high tinctorial materials such as carbon black or colloidal silver are preferably present in the emulsion.

Particularly preferred photopolymer compositions include those described in the aforementioned Held, U.S. Pat. No. 4,923,389, the disclosure of which is incorporated herein by reference. These include monomeric compounds that polymerize in the presence of a photoinitiator when exposed to light. A preferred monomeric compound is trimethylolpropane triacrylate (TMPTA) and a preferred initiator o-chloro-4,5-bis(m-methoxyphenyl)-imidazolyl dimer (o-Cl-HABI). These ingredients are usually prepared in a suitable binder which may also be gelatin.

The abrasion overcoat layer is preferably a polyvinyl alcohol (PVA) or gelatin layer containing the wash-off, crosslinking developer. This developer, also called a "tanning developer" is preferably a biscatechol compound of the formula $C_{21}H_{29}O_4$, CAS No. 77-08-7, (Shawnee Chemicals, Springfield, Ohio) e.g., TTS-5, as disclosed in the above referenced U.S. Pat. No. 4,923,389. The weight of the developer in the abrasion overcoat layer ranges from 5 to 30% by weight, preferably 10–20% by weight, based on the total weight of the layer.

A particularly preferred element is shown in FIG. 1, wherein, as previously stated, 2 is the fogged silver halide layer which may be comprised of any of the conventional silver halides dispersed in a gelatin binder. This layer will also preferably contain a colorant such as carbon black in an amount of 0.03 to 0.06 g per gram of emulsion and most preferably in an amount of 0.04 to 0.05 g/g of emulsion. The silver halide layer is coated on a 4 mil biaxially oriented, stretched and heat relaxed polyethylene terephthalate film (1) which contains a resin sub over which has been coated a thin layer of gelatin to aide in the coating of subsequent layers. On top of silver halide layer (2), a photopolymer layer (3) is coated. This layer comprises the aforementioned monomer (TMPTA) and initiator (o-Cl-HABI) dispersed in a gelatin binder. The composition of this layer is from 15 to 50 weight % of the monomer, 2.5 to 8.0 weight % of the initiator and from 17 to 58 weight % of the binder. The abrasion overcoat layer (4) is preferably a mixture of TTS-5 dispersed in a PVA binder wherein the TTS-5 is present in the range of 15 to 45 weight %, based on total solids present. After all layers are coated, the coating weights will be about 0.10 to 2.0 g/m$^2$ of silver for layer (2), 1.0 to 5.0 g/m$^2$ for layer 3, and 0.5 to 2.0 g/m$^2$ for layer 4. The dried coatings are then ready for exposure and processing to produce a direct positive image.

If the silver halide grains have not been previously chemically fogged to create the requisite fog centers, exposure is achieved by first giving the silver halide element an overall exposure, for example through the transparent support, to fog the silver halide grains. Once the grains have been fogged, the photopolymer layer is image-wise exposed to crosslink the monomer in the exposed areas. After exposure, the element is then immersed in an aqueous alkaline solution, e.g., sodium carbonate solution, to release the tanning developer contained in the abrasion layer. The tanning developer will then migrate preferentially through the unexposed, unpolymerized areas of the photopolymer layer, causing the gelatin in the contiguous areas of the silver halide emulsion directly under the photopolymer layer to crosslink and harden. Washing the element in warm water will remove the unhardened portions of the emulsion, the photopolymer layer and the abrasion layer, resulting in a high quality, direct positive image.

This invention will now be illustrated by the following examples:

EXAMPLE 1

Preparation of the Gel Underlayer

The following ingredients were placed in a suitable vessel:

| Ingredient | Amount (gm) |
| --- | --- |
| Water | 250 |
| Gelatin | 10 |
| Wetting Agent Mixture (see below) | 5 |
| FC-128 ® anionic fluorosurfactant (3M Co., St. Paul, MN; 5% solution) | 5 |

The aforementioned "Wetting Agent Mixture" was comprised of:

| Ingredient | Amount (gm) |
| --- | --- |
| Aerosol ® OT-75 surfactant (American Cyanamid, Wayne, NJ) | 12.5 |
| Aerosol ® TR-75 anionic surfactant (American Cyanamid, Wayne, NJ) | 12.5 |
| Distilled water | 225 |

These ingredients were thoroughly mixed until all was dissolved. This material was then coated over a 4 mil, dimensionally stable, polyethylene terephthalate support which had been suitably subbed.

Preparation of the Gelatin, Positive Working Silver Halide Layer

| Ingredient | Amount (gm) |
| --- | --- |
| Water | 260 |
| Gelatin | 12.6 |

The gelatin was thoroughly dissolved in the water by mixing at 40° C. for 30 min and then the remainder of the ingredients added thereto as follows:

| Ingredient | Amount (gm) |
| --- | --- |
| Gelatino silver chlorobromide emulsion (20 mole % chloride) | 30 |
| Acrysol ® WS-50 acrylic latex (Rohm & Haas Co., Philadelphia, PA) | 5 |
| An 8% soln. of polyethylene oxide, MW 1000, + 6% benzenesulfinic acid in dist. water (PEO/BS) | 13 |
| 4-acetylaminophenol, 14% in ethanol (4-AAP) | 8.4 |

The pH of this mixture was adjusted to 5.9 and 55 g of a carbon black dispersion which comprises a mixture of finely dispersed carbon black particles (Heliocht Schwarz, from Bayer AG, Leverkusen, Germany) was added to this mixture and stirred thoroughly to insure complete dispersion. This material was then coated over the above gelatin layer using a 2 mil thick coating knife.

Preparation of the Photopolymer Layer

The following ingredients were mixed in a suitable container:

| Ingredient | Amount (gm) |
|---|---|
| Aqueous Phase: | |
| Gelatin | 18 |
| 40% Aq. PVA/Polyvinylpyrollidone mixture Triton ® Q544, phosphate ester, (Rohm & Haas Co., Philadelphia, PA) | 5 |
| FC-128 Fluoroinated surfactant (see above) | 5 |
| Water | 230 |
| Methylene chloride | 1 |
| Organic Phase: | |
| TMPTA | 20 |
| Plasthall ® 4141 (C. P. Hall Co., Chicago, IL) | 3 |
| o-Cl-HABI | 3 |
| Michler's ketone | 0.2 |
| Benzophenone | 1.5 |
| Methylene chloride | 25 |

The Aqueous and Organic Phases were blended together for about 15 minutes and then coated over the aforementioned positive silver halide layer from above using a 4 mil knife.

Preparation of the Overcoat Layer

The following ingredients were mixed:

| Ingredient | Amount (gm) |
|---|---|
| Deionized water | 7250 |
| Polyvinyl alcohol | 400 |

These ingredients were cold soaked with stirring for 10 minutes and then heated to 195° F. (about 90° C.) with slow stirring. After digesting at this temperature for 60 minutes, the mixture was cooled to 105° F. (about 41° C.) and the following added slowly thereto:

| Ingredient | Amount (gm) |
|---|---|
| Polyvinylpyrrolidone | 200 |
| Naccanol ® 90F, nonionic surfactant, (Stephan Chem. Co., Northfield, IL) | 175 |
| Brij ® 30, polyoxyethylene-4-lauryl ether (ICI Americas, Inc., Wilmington, DE) | 100 |
| TTS-5 | 400 |
| 40% Aqueous Bead Soln, (polyethylene beads, Poligen ®, PE, (BASF Wyandotte Co. Holland, MI)) | 120 |

After cooling to 102° F. (ca. 39° C.) the weight was adjusted to 9090 g total with deionized water and the pH adjusted to 6.6. This material was then coated over the photopolymer layer, at about 0.4 g/m² as PVA.

All of these layers were fully dried and samples of the resulting film were taken. The positive working silver halide layer was given a general back flash through the transparent support to fog the silver halide grains. The photopolymer layer was then image-wise exposed through a positive image at varying times with a 5 KW pulsed Xenon light source. The resulting product was then developed by processing in a standard Cronaflow ® Processor (E. I. du Pont de Nemours and Company, Wilmington, Del.) which contained a standard aqueous sodium carbonate developer. The resulting image was then fixed by wash-out of the non-imaged areas. The wash-out also removed the abrasion and photopolymer layers leaving a high quality, direct positive, high tinctorial image of the original. This method for obtaining such a high quality direct positive at such low silver coating weight is unique and saves considerable cost of materials.

What is claimed is:

1. A positive-working low silver wash-off element comprising, in order:
   (a) a support;
   (b) a gelatino, fogged silver halide emulsion layer;
   (c) a layer of a hydrophilic macromolecular organic polymer dispersion medium including a dispersed phase containing
      (i) a least one ethylenically unsaturated monomer having a boiling point above 100° C. at normal atmospheric pressure and being capable of forming a high polymer by free-radical initiated, chain-propagating addition polymerization; and
      (ii) in reactive association with the monomer, at least one free-radical photoinitiator or photoinitiator system activatable by actinic radiation in an amount from 0.01 to 20% by weight of the total solids in the dispersion; and
   (d) an abrasion overcoat layer comprising an organic binder and a tanning developer.

2. The element of claim 1 wherein the silver halide emulsion layer further comprises a colorant.

3. The element of claim 2 wherein said colorant is carbon black.

4. The element of claim 1 wherein a gel layer is present between the support and the silver halide layer.

5. The element of claim 1 wherein the abrasion overcoat layer further comprises a dispersion of polyethylene particles.

6. The element of claim 1 wherein the macromolecular organic polymer is gelatin, the ethylenically unsaturated monomer is trimethylolpropane triacrylate and the initiator is o-cholophenyl-4,5-bis(m-methoxyphenyl-imidazoyl dimer.

7. The element of claim 1 wherein said silver halide emulsion comprises silver chlorobromide.

* * * * *